(12) United States Patent
Proebsting et al.

(10) Patent No.: US 7,139,993 B2
(45) Date of Patent: Nov. 21, 2006

(54) METHOD AND APPARATUS FOR ROUTING DIFFERENTIAL SIGNALS ACROSS A SEMICONDUCTOR CHIP

(75) Inventors: Robert J. Proebsting, Sonora, CA (US); Ronald Ho, Mountain View, CA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 376 days.

(21) Appl. No.: 10/810,284

(22) Filed: Mar. 26, 2004

(65) Prior Publication Data

US 2005/0216876 A1    Sep. 29, 2005

(51) Int. Cl.
*G06F 17/50* (2006.01)

(52) U.S. Cl. ............... 716/12; 716/13; 716/14; 716/15; 716/16; 257/776; 365/69

(58) Field of Classification Search ............ 716/12–16; 257/776; 365/69
See application file for complete search history.

(56) References Cited

U.S. PATENT DOCUMENTS

| | | | | | |
|---|---|---|---|---|---|
| 5,311,477 A | * | 5/1994 | Rastegar | ................ | 365/230.05 |
| 5,485,419 A | * | 1/1996 | Campbell | .................... | 365/69 |
| 5,534,732 A | * | 7/1996 | DeBrosse et al. | ........... | 257/776 |
| 6,005,265 A | * | 12/1999 | Kuroda | ........................ | 257/208 |
| 6,034,879 A | * | 3/2000 | Min et al. | ...................... | 365/63 |
| 6,043,562 A | * | 3/2000 | Keeth | .......................... | 257/776 |
| 6,163,475 A | | 12/2000 | Proebsting | .................... | 365/63 |
| 6,259,621 B1 | * | 7/2001 | Li et al. | ....................... | 365/69 |

* cited by examiner

*Primary Examiner*—Thuan Do
*Assistant Examiner*—Naum Levin
(74) *Attorney, Agent, or Firm*—Park, Vaughan & Fleming LLP

(57) ABSTRACT

One embodiment of the present invention provides an arrangement of differential pairs of wires that carry differential signals across a semiconductor chip. In this arrangement, differential pairs of wires are organized within a set of parallel tracks on the semiconductor chip. Furthermore, differential pairs of wires are organized to be non-adjacent within the tracks. This means that each true wire is separated from its corresponding complement wire by at least one intervening wire in the set of parallel tracks, thereby reducing coupling capacitance between corresponding true and complement wires. Moreover, this arrangement may include one or more twisting structures, wherein a twisting structure twists a differential pair of wires so that the corresponding true and complement wires are interchanged within the set of parallel tracks.

8 Claims, 4 Drawing Sheets

A ─────────────────────────────

B ----------------------------

A̅ ─────────────────────────────

B̅ ----------------------------

METHOD AND APPARATUS FOR ROUTING DIFFERENTIAL SIGNALS ACROSS A SEMICONDUCTOR CHIP

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for routing signals across a semiconductor chip. More specifically, the present invention relates to a method and an apparatus for routing differential signals across a semiconductor chip in a manner that reduces effective capacitance and differential coupling.

2. Related Art

As processor clock speeds continue to increase at an exponential rate, data must be transferred at correspondingly faster rates between computer system components. This can be a problem for conventional bus structures because the faster switching speeds and smaller voltage swings in the latest generation of semiconductor chips cause signal lines to be more sensitive to noise.

To remedy this problem, designers are beginning to use differential signaling to transmit signals across a semiconductor chip. Differential signaling uses two signal lines to carry a "true" and "complement" version of each signal, wherein the value of the signal is indicated by the voltage difference between the two signal lines. Because currents are balanced between power and ground rails, differential signaling reduces power supply noise and effectively provides return currents. Moreover, differential signaling is less sensitive to ground shifts (or other common mode noise) between sender and receiver because differential signaling relies on voltage differences between pairs of signal lines, instead of relying on an absolute voltage level of a single signal line.

As the demand for higher bandwidth continues to increase, designers are beginning to pack differential wires tightly together to increase the total number of communication channels. However, when differential wires are packed tightly together, they can potentially interfere with each other through energy coupling, which can have deleterious effects on performance and reliability. For example, FIG. 1 illustrates a differential pair of wires, A and $\overline{A}$, which carry complementary signals. Hence, if A moves up, $\overline{A}$ moves down, and vice versa. The differential pair, B and $\overline{B}$, operates in the same manner. Note that these differential pairs typically belong to a wider signal bus, which includes additional differential pairs of the same length that run in the same direction.

In the arrangement of wires as illustrated in FIG. 1, signals in neighboring wires can potentially interfere with each other. For example, if a signal in wire B moves up, the corresponding complement signal in wire $\overline{B}$ moves down. Since wire $\overline{A}$ is adjacent to wire B, this can couple energy into wire $\overline{A}$, which can potentially cause errors or reduce performance. Furthermore, note that signals in wires $\overline{A}$ and B can disturb each along the entire length of the wires.

In order to remedy this problem, designers sometimes "twist" differential pairs of wires. For example, FIG. 2 illustrates a "fully-twisted" wiring scheme. In this fully-twisted scheme, if wire B moves up, it couples wire $\overline{A}$ upwards for ¼ of the wire length, but it also couples wire A upwards for ¼ of the wire length. At the same time, wire $\overline{A}$ has the same downward effect on both B and $\overline{B}$. Hence, the net coupling effect is zero in the first order.

Note, however, that wires A and $\overline{A}$ (and wires B and $\overline{B}$) are adjacent, and typically with minimal spacing. The line-to-line capacitance of two adjacent wires in a modem technology is approximately 70% of the total capacitance of the wire. In addition, the effective capacitance between any two physical structures doubles when the voltage on those two structures swings in opposite directions. Consequently, this fully-twisted scheme doubles the wire-to-wire "effective" capacitance seen by each wire, thereby causing higher power dissipation as well as longer delay.

Hence, what is needed is a method and an apparatus for routing differential signals across a semiconductor chip in a manner that reduces effective capacitance as well as differential coupling.

SUMMARY

One embodiment of the present invention provides an arrangement of differential pairs of wires that carry differential signals across a semiconductor chip. In this arrangement, differential pairs of wires are organized within a set of parallel tracks on the semiconductor chip. Furthermore, differential pairs of wires are organized to be non-adjacent within the tracks. This means that each true wire is separated from its corresponding complement wire by at least one intervening wire in the set of parallel tracks, thereby reducing coupling capacitance between corresponding true and complement wires. Moreover, this arrangement may include one or more twisting structures, wherein a twisting structure twists a differential pair of wires so that the corresponding true and complement wires are interchanged within the set of parallel tracks.

In a variation on this embodiment, the one or more twisting structures are arranged so that substantially zero net differential coupling capacitance exists for each differential pair of wires.

In a variation on this embodiment, the set of parallel tracks includes a possibly repeating pattern of four adjacent tracks, including a first track, which is adjacent to a second track, which is adjacent to a third track, which is adjacent to a fourth track. Furthermore, the differential pairs of wires include a first differential pair, A and $\overline{A}$, and a second differential pair, B and $\overline{B}$, wherein A starts in the first track, B starts in the second track, $\overline{A}$ starts in the third track and $\overline{B}$ starts in the fourth track. A first twisting structure causes B and $\overline{B}$ to interchange, so that A is in the first track, $\overline{B}$ is in the second track, $\overline{A}$ is in the third track and B is in the fourth track. A second twisting structure causes A and $\overline{A}$ to interchange, so that $\overline{A}$ is in the first track, $\overline{B}$ is in the second track, A is in the third track and B is in the fourth track. Finally, a third twisting structure causes $\overline{B}$ and B to interchange, so that $\overline{A}$ is in the first track, B is in the second track, A is in the third track and $\overline{B}$ is in the fourth track.

In a variation on this embodiment, the first twisting structure is located approximately one quarter of the way down the set of parallel tracks; the second twisting structure is located approximately one half of the way down the set of parallel tracks; and the third twisting structure is located approximately three quarters of the way down the set of parallel tracks.

In a variation on this embodiment, the first twisting structure is located more than one quarter of the way down the set of parallel tracks; the second twisting structure is located more than one half of the way down the set of parallel tracks; and the third twisting structure is located more than three quarters of the way down the set of parallel tracks.

In a variation on this embodiment, the set of parallel tracks includes a possibly repeating pattern of four adjacent tracks, including a first track, which is adjacent to a second track, which is adjacent to a third track, which is adjacent to a fourth track. Furthermore, the differential pairs of wires include a first differential pair, A and $\overline{A}$, and a second differential pair, B and $\overline{B}$, wherein A starts in the first track, B starts in the second track, $\overline{A}$ starts in the third track and $\overline{B}$ starts in the fourth track. A first twisting structure causes A and $\overline{A}$ to interchange, so that $\overline{A}$ is in the first track, B is in the second track, A is in the third track and $\overline{B}$ is in the fourth track.

In a variation on this embodiment, the first twisting structure is located approximately one half of the way down the set of parallel tracks.

In a variation on this embodiment, the first twisting structure is located more than one half of the way down the set of parallel tracks.

In a variation on this embodiment, the set of parallel tracks includes a possibly repeating pattern of six adjacent tracks, including a first track, which is adjacent to a second track, which is adjacent to a third track, which is adjacent to a fourth track, which is adjacent to a fifth track, which is adjacent to a sixth track. Furthermore, the differential pairs of wires include a first differential pair, A and $\overline{A}$, a second differential pair, B and $\overline{B}$, and a third differential pair, C and $\overline{C}$, wherein A starts in the first track, B starts in the second track, $\overline{A}$ starts in the third track, C starts in the fourth track, $\overline{B}$ starts in the fifth track and $\overline{C}$ starts in the sixth track. A first twisting structure causes A and $\overline{A}$ to interchange, so that $\overline{A}$ is in the first track, B is in the second track, A is in the third track, C is in the fourth track, $\overline{B}$ is in the fifth track and $\overline{C}$ is in the sixth track.

In a variation on this embodiment, the first twisting structure is located approximately one half of the way down the set of parallel tracks.

In a variation on this embodiment, the first twisting structure is located more than one half of the way down the set of parallel tracks.

In a variation on this embodiment, the set of parallel tracks are located within the same metal layer in the semiconductor chip, and the one or more twisting structures use at least one other metal layer to interchange signals between tracks.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Intertwisted Wire Set

Figure 1:
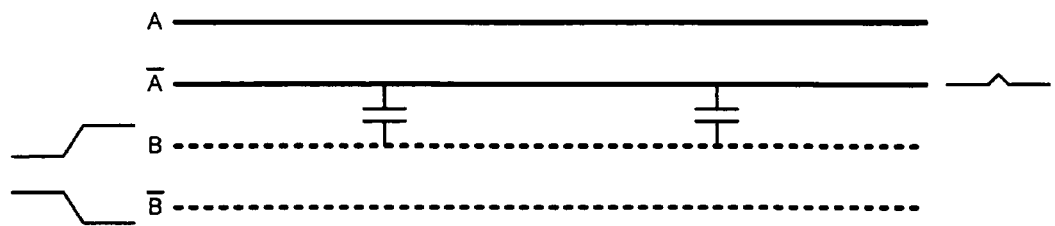
FIG. 1 illustrates an untwisted wire set.
Figure 2:
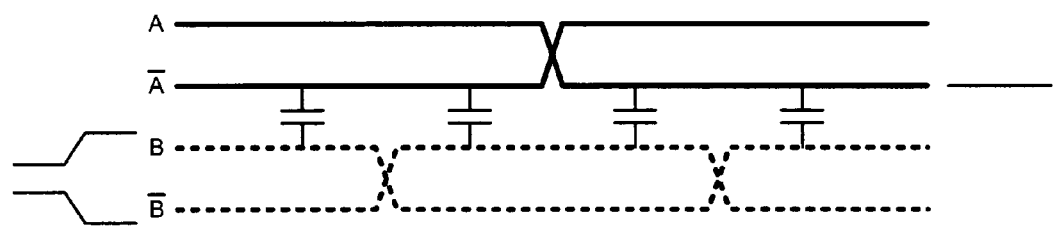
FIG. 2 illustrates a fully-twisted wire set.

Although the conventional fully-twisted wire set illustrated in FIG. 2 works reasonably well, it fully exposes each wire to its complement. As a result, on any wire's transition, the capacitance between that wire and its neighboring complement will always be maximal.

More specifically, assuming a line-to-grounded-line coupling capacitance of $C_c$ for the full length of the wire, and assuming all wires are homogenous so that $C_c$ is the same for each pair of wires, in the fully-twisted scheme any switching wire will have a total effective coupling capacitance of $3C_c$. Of this coupling capacitance, $2C_c$ is due to its complement, because its complement moves in the opposite direction, and $C_c$ is due to its neighbor because exactly half of its neighbor will switch in the opposite direction (causing an effective capacitance of $2C_c$ for half the length of the wire) and the other half switches in the same direction (causing an effective capacitance of zero), or its neighbor does not switch, in which case the entire length of the wire still has an effective capacitance of $C_c$ to its unrelated neighbor.

Figure 3:
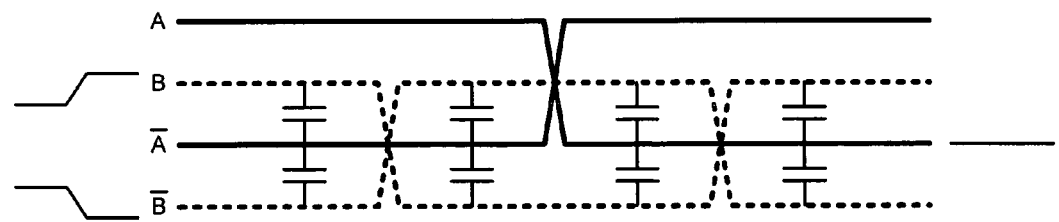
FIG. 3 illustrates an intertwisted wire set in accordance with an embodiment of the present invention.

By contrast, the intertwisted wire set illustrated in FIG. 3 interleaves wires pairwise to break apart this close coupling between a wire and its complement. As with the fully-twisted scheme illustrated in FIG. 2, a voltage step on either wire set A or wire set B will introduce no net coupling on the other wire set.

In addition, a significant improvement arises from the interleaving of two pairs of wires. This interleaving separates A from its complement $\overline{A}$, as well as B from its complement $\overline{B}$. Hence, when A moves up and $\overline{A}$ moves down, they do not suffer from the increased capacitance cost present in the fully-twisted scheme. This means that the intertwisted scheme consumes less power to charge this capacitance, and furthermore takes less time to transmit voltage signals down the wire. Consequently, in the intertwisted scheme, any wire's coupling capacitance is $2C_c$, which is about a 30% improvement. This is the same as if both neighboring wires were grounded.

Note that this intertwisted scheme saves quite a bit of energy and delay, since coupling capacitance makes up close to 70% of the total wire capacitance in modem technologies with tall wires. Moreover, this intertwisted scheme rejects noise just as well as the fully-twisted scheme does.

Pairwise-Minimal Intertwisted Wire Set

Figure 4:
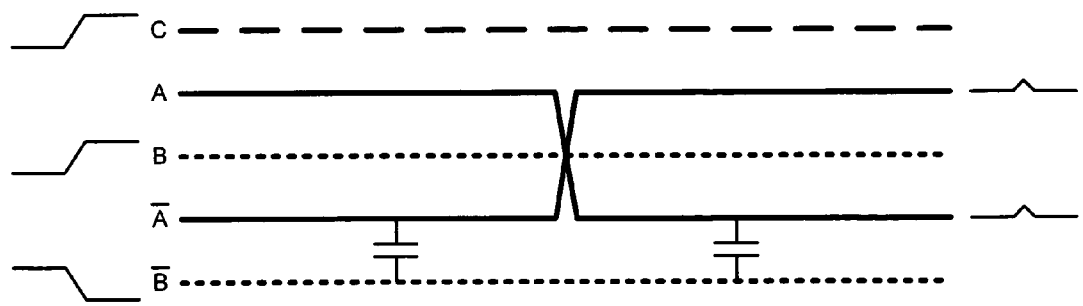
FIG. 4 illustrates a pairwise-minimal intertwisted wire set in accordance with an embodiment of the present invention.

For wire systems that care about differential noise but not common-mode noise, a simpler pattern can reduce the number of twists with no loss in differential noise rejection. FIG. 4 illustrates this "pairwise-minimal intertwisted"

scheme in accordance with an embodiment of the present invention. In this scheme, only wire set A is twisted, while wire set B runs straight through. As with the intertwisted scheme, wire sets A and B do not interfere differentially with each other and they also do not couple into themselves, which reduces capacitance and thereby saves power and delay.

In this scheme, there are fewer twists, and hence fewer wire obstructions on the metallization layers immediately above and below the wires A and B. On the other hand, the drawback is that if wire B switches up (and $\overline{B}$ switches down), then wires A and $\overline{A}$ see a uniform upward disturbance. Note that this is not a differential noise, but a common-mode noise, which can often be ignored in digital systems.

In the FIG. 4, wire C represents the bottom of the next pair of wire sets. Note that this pattern can be repeated with no differential coupling between repeated patterns.

Three-Way-Minimal Intertwisted Wire Set

Figure 5:
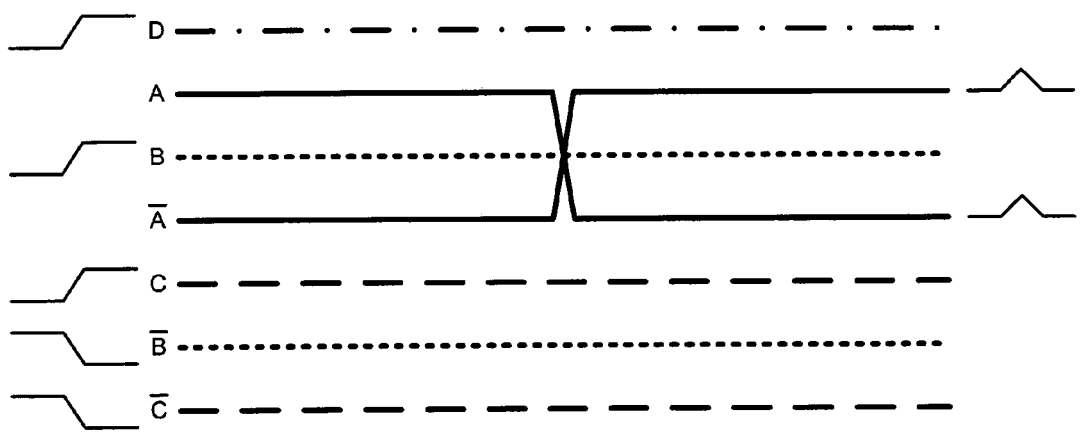
FIG. 5 illustrates a three-way-minimal intertwisted wire set in accordance with an embodiment of the present invention.

FIG. 5 illustrates a "three-way-minimal intertwisted" wire set in accordance with an embodiment of the present invention. This three-way-minimal intertwisted wire set offers the same benefits in rejecting differential noise as the pair-wise-minimal intertwisted scheme illustrated in FIG. 4. Except here, wire sets A, B, and C can coexist with no differential coupling between each other, while only paying the cost of a single twist among them. Like the pairwise-minimal intertwisted scheme, this three-way-minimal intertwisted scheme does not reject common-mode noise.

In FIG. 5, wire D represents the bottom of the next three-way pattern of wire sets. Note that this pattern can be repeated with no differential coupling between repeated patterns.

Also note that the wires need not be part of the same bus that transmits from location X to location Y on a chip. In particular, if wires A and $\overline{A}$ are part of a bus from X to Y, and wires B and $\overline{B}$ are part of a different bus, either running in the reverse direction (from Y to X), or even to and from wholly different sources and receivers, the scheme is still applicable. To minimize noise as well as delay and power, the wires need only twist in an interleaved fashion.

Wire Twists

Figure 6:
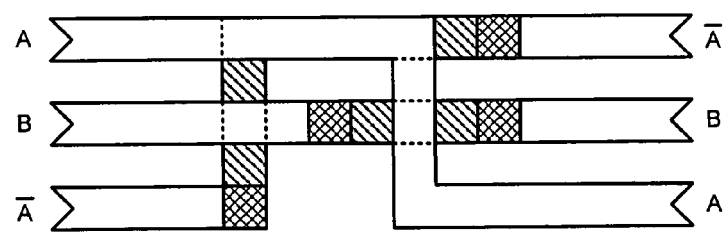
FIG. 6 illustrates a wire twist in accordance with an embodiment of the present invention.

As is illustrated in FIG. 6, in one embodiment of the present invention a wire twist requires side routes in another routing layer to accomplish a twist between wires A and $\overline{A}$ across an intervening wire B. More specifically, the wire A moves from the first track to the third track directly, without a side route through another layer. The wire B does not changes tracks, but passes under (or over) the wire A. This is accomplished by passing through a via (indicated by cross-hatching) to another routing layer (indicated by a diagonal pattern) before returning through another via to its original layer. The wire $\overline{A}$ similarly passes (from left to right) through a via into a vertical strip in the other layer, which passes under (or over) wire B and then passes underneath wire A for some distance before returning through a via to its original layer.

Note that in technologies that allow wires at 45 degrees, twists can cost less than in this Manhattan layout. Also note that fully-landed and fully-enclosed vias typically require more room than a wire's minimum-allowed width, but these are long wires and are typically wider than minimum.

Using too few vias to connect two wires leads to poor performance. Technologies with aluminum wires use poorly-conducting tungsten vias, and consequently have resistance values of 5–10 Ohms per via. In this case, one via is certainly not sufficient, and even four may not be, either. Processes with copper help significantly, because they pour the vias in the same step as pouring the wires, making a via equivalent to an extra square of length. However, even in copper technologies it is advantageous to array many vias together, because vias serve as nucleation sites for voids that migrate down the wire during operation.

Hence, the true cost of twists is probably closer to five or more wire pitches. In a wire several thousand microns long, this may be seem insignificant but still leads to inconvenient layout constraints.

Twists also lead to a slight imbalance in the wire characteristics. With enough vias to minimize twist resistance, the effects of the twist are trivial relative to the rest of the long wire. In addition, on-chip wires are not "transmission-line-like" enough to make twists meaningful from an impedance-matching perspective.

Location of Wire Twists

For the schemes depicted in FIGS. 4 and 5, one might wonder if twisting at the mid-way point is best. Any wires that run bi-directionally would best be served by twists at the midway position.

Consider, however, in FIG. 4 the noise coupled onto $\overline{B}$ from A and $\overline{A}$, with the twist at the mid-way position. Here, we are concerned about the noise at the receiver end, or the far right, of wire $\overline{B}$. The current injected onto $\overline{B}$ from A is closer to $\overline{B}$'s right end than the current injected onto $\overline{B}$ from $\overline{A}$. This matters because the current injected onto $\overline{B}$ will split: some will go left, and some will go right. The further from the right that the current enters, the less that will actually go to the right.

Note that moving the twist to the right can help because it makes more of the injected current from $\overline{A}$ go to the right to balance out the injected current from A. However, moving it too far makes the injected current from $\overline{A}$ too strong.

Twists Can Occur at Bends in Parallel Tracks

Figures 7, 8A:
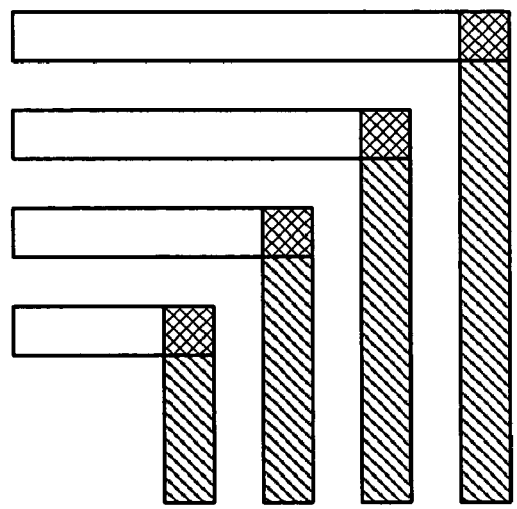
FIG. 7 illustrates an untwisted wire set in accordance with an embodiment of the present invention.
FIG. 8A illustrates a bend in a set of parallel tracks.
Figure 8B:
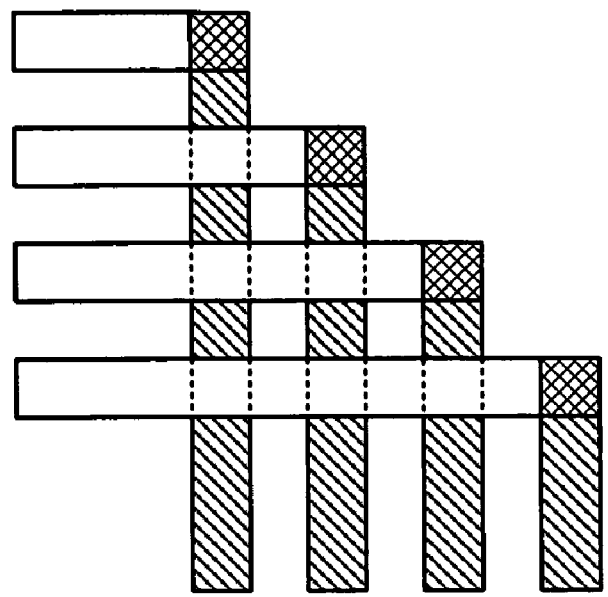
FIG. 8B illustrates another bend in a set of parallel tracks.

Note that a set of parallel tracks can bend (for example, by ninety-degrees) in order to connect two components on the semiconductor die. This is typically performed as is illustrated in FIGS. 8A and 8B. Note that in an integrated circuit layout it is common to have one metal layer dedicated to horizontal signal lines and another adjacent metal layer dedicated to vertical signal lines. Hence, if a wire bends by ninety degrees (from horizontal to vertical or from vertical to horizontal) a via is typically used to connect the horizontal signal line to the vertical signal line. Hence, in the examples illustrated in FIGS. 8A and 8B, note that when the set of parallel tracks bends ninety degrees, the wires move through vias (indicated by cross-hatching) to another metal layer (indicated by a diagonal pattern). Also note that the bend illustrated in FIG. 8A reverses the order of the wires, whereas the bend illustrated in FIG. 8B does not.

Figure 8C:
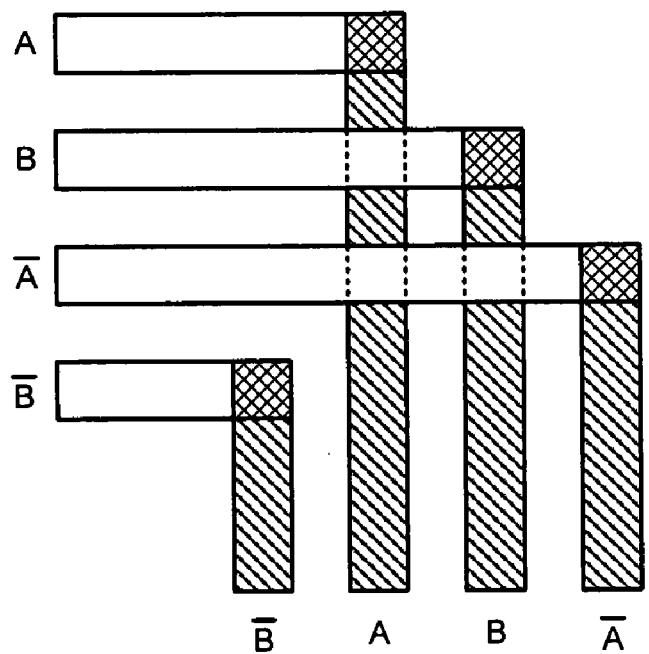
FIG. 8C illustrates a bend in a set of parallel tracks in accordance with an embodiment of the present invention.

In the embodiment of the present invention, a true wire can be easily exchanged with its complement by staggering the bends in the true and complement wires relative to each other so that the true and complement wires cross as is illustrated in FIG. 8C. In FIG. 8C note that signals A and $\overline{A}$ are interchanged at the ninety-degree bend. Furthermore, note that since vias are already used to perform a ninety-degree bend (as is illustrated in FIGS. 8A and 8B) no additional vias are required to accomplish this interchange, and hence there is no additional cost for this crossover.

Untwisted Wire Set

FIG. 7 illustrates an untwisted wire set in accordance with an embodiment of the present invention. In this wire set, each wire is separated from its complement by an intervening wire. For example, wire A is separated from wire $\overline{A}$ by the intervening wire B. Note that this untwisted pattern repeats for additional wires. Moreover, this untwisted pattern provides similar power reduction benefits of the previous embodiments (illustrated in FIGS. 3–6), as well as some noise cancellation benefits, without the need for twisting structures to interchange the wires.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An arrangement of differential pairs of wires that carry differential signals across a semiconductor chip, comprising:
   a set of parallel tracks on the semiconductor chip that are used to route the differential pairs of wires;
   wherein each differential pair of wires includes a true wire and a complement wire that carry corresponding true and complement signals;
   wherein the differential pairs of wires are non-adjacent, so that each true wire is separated from its corresponding complement wire by at least one intervening wire in the set of parallel tracks, thereby reducing coupling capacitance between corresponding true and complement wires; and
   one or more twisting structures, wherein a twisting structure twists a differential pair of wires so that the corresponding true and complement wires are interchanged within the set of parallel tracks, and wherein the one or more twisting structures are arranged so that substantially zero net differential coupling capacitance exists for each differential pair of wires,
   wherein the set of parallel tracks includes a possibly repeating pattern of six adjacent tracks, including a first track, which is adjacent to a second track, which is adjacent to a third track, which is adjacent to a fourth track, which is adjacent to a fifth track, which is adjacent to a sixth track;
   wherein the differential pairs of wires include a first differential pair, A and $\overline{A}$, a second differential pair, B and $\overline{B}$, and a third differential pair, C and $\overline{C}$;
   wherein A starts in the first track, B starts in the second track, $\overline{A}$ starts in the third track, C starts in the fourth track, $\overline{B}$ starts in the fifth track and $\overline{C}$ starts in the sixth track; and
   wherein a first twisting structure causes A and $\overline{A}$ to interchange, so that $\overline{A}$ is in the first track, B is in the second track, A is in the third track, C is in the fourth track, $\overline{B}$ is in the fifth track and $\overline{C}$ is in the sixth track.

2. The arrangement of claim 1, wherein the first twisting structure is located approximately one half of the way down the set of parallel tracks.

3. The arrangement of claim 1, wherein the first twisting structure is located more than one half of the way down the set of parallel tracks.

4. The arrangement of claim 1,
   wherein the set of parallel tracks are located within the same metal layer in the semiconductor chip; and
   wherein the one or more twisting structures use at least one other metal layer to interchange signals between tracks.

5. A method for arranging differential pairs of wires to carry differential signals across a semiconductor chip, wherein each differential pair of wires includes a true wire and a complement wire that carry corresponding true and complement signals, the method comprising:
   defining a set of parallel tracks on the semiconductor chip, which are used to route the differential pairs of wires;
   mapping differential pairs of wires to tracks so that the differential pairs of wires are non-adjacent, which means that each true wire is separated from its corresponding complement wire by at least one intervening wire in the set of parallel tracks, thereby reducing coupling capacitance between corresponding true and complement wires; and
   locating one or more twisting structures, wherein a twisting structure twists a differential pair of wires so that the corresponding true and complement wires are interchanged within the set of parallel tracks, wherein the one or more twisting structures are located so that substantially zero net differential coupling capacitance exists for each differential pair of wires,
   wherein the set of parallel tracks includes a possibly repeating pattern of six adjacent tracks, including a first track, which is adjacent to a second track, which is adjacent to a third track, which is adjacent to a fourth track, which is adjacent to a fifth track, which is adjacent to a sixth track;
   wherein the differential pairs of wires include a first differential pair, A and $\overline{A}$, a second differential pair, B and $\overline{B}$, and a third differential pair, C and $\overline{C}$;
   wherein A starts in the first track, B starts in the second track, $\overline{A}$ starts in the third track, C starts in the fourth track, $\overline{B}$ starts in the fifth track and $\overline{C}$ starts in the sixth track; and
   wherein a first twisting structure causes A and $\overline{A}$ to interchange, so that $\overline{A}$ is in the first track, B is in the second track, A is in the third track, C is in the fourth track, $\overline{B}$ is in the fifth track and $\overline{C}$ is in the sixth track.

6. The method of claim 5, wherein the first twisting structure is located approximately one half of the way down the set of parallel tracks.

7. The method of claim 5, wherein the first twisting structure is located more than one half of the way down the set of parallel tracks.

8. The method of claim 5,
   wherein the set of parallel tracks are located within the same metal layer in the semiconductor chip; and
   wherein the one or more twisting structures use at least one other metal layer to interchange signals between tracks.

* * * * *